US012707577B2

(12) United States Patent
Yang et al.

(10) Patent No.: US 12,707,577 B2
(45) Date of Patent: Aug. 11, 2026

(54) POWER CONVERTER

(71) Applicant: Huawei Digital Power Technologies Co., Ltd., Shenzhen (CN)

(72) Inventors: Gun Yang, Shenzhen (CN); Luo Li, Xi'an (CN); Maofan Li, Dongguan (CN); Xuan Liu, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 231 days.

(21) Appl. No.: 18/584,416

(22) Filed: Feb. 22, 2024

(65) Prior Publication Data

US 2024/0292553 A1 Aug. 29, 2024

(30) Foreign Application Priority Data

Feb. 23, 2023 (CN) ......................... 202310194411.8

(51) Int. Cl.

*H05K 5/02* (2006.01)
*H01F 27/06* (2006.01)
*H02M 1/32* (2007.01)

(52) U.S. Cl.

CPC ........... *H05K 5/0217* (2013.01); *H01F 27/06* (2013.01); *H02M 1/327* (2021.05)

(58) Field of Classification Search

CPC ....... H05K 5/0217; H02M 1/327; H01F 27/06
See application file for complete search history.

(56) References Cited

U.S. PATENT DOCUMENTS

2016/0125997 A1 5/2016 Hwang
2022/0338390 A1* 10/2022 She ...................... H05K 7/2089

FOREIGN PATENT DOCUMENTS

CN 205754008 U 11/2016
CN 206650178 U 11/2017
CN 208016160 U 10/2018
CN 110364328 A * 10/2019 ............... H05K 7/02
CN 212909365 U 4/2021
CN 213660133 U 7/2021
CN 216435625 U 5/2022
EP 3576280 A1 12/2019

OTHER PUBLICATIONS

CN 110364328 A English translation. (Year: 2019).*

* cited by examiner

*Primary Examiner* — Mukundbhai G Patel
(74) *Attorney, Agent, or Firm* — Conley Rose, P.C.

(57) ABSTRACT

A power converter includes a housing, a power device, a circuit board, a connection piece, and an inductor apparatus. The power device is installed on the circuit board, and an accommodation cavity is formed in the housing and is configured to accommodate the circuit board and the power device. A through-hole is provided on a surface that is of the housing and that faces the circuit board. The inductor apparatus is completely exposed or partially exposed outside the housing and covers the through-hole. The connection piece extends from the circuit board in the housing to the inductor apparatus, and passes through a surface of the housing to physically connect the inductor apparatus to the housing and electrically connect the power device to the inductor apparatus at the same time.

20 Claims, 8 Drawing Sheets

POWER CONVERTER

CROSS-REFERENCE TO RELATED DISCLOSURES

This application claims priority to Chinese Patent Application No. 202310194411.8, filed on Feb. 23, 2023, which is hereby incorporated by reference in its entirety.

TECHNICAL FIELD

This application relates to the electric energy conversion field, and in particular, to a power converter.

BACKGROUND

Currently, a power converter usually uses an external inductor apparatus, and wires that are led out from the inductor apparatus and that are connected to an inductor are cables and pass through a box of the power converter. In addition, cables led out from the inductor apparatus are bundled and led out to the box of the power converter. When the cables are led out from the inductor apparatus to the box, the cables in bundles are more complex, and the cables need to be manually arranged and fastened to the box of the power converter. It takes a long time to install an inductor with cables, and manufacturing costs are high.

SUMMARY

In view of this, this application provides a power converter, to reduce a time required for arranging cables, improve efficiency of assembling an inductor and cables, and reduce costs.

A first aspect of embodiments of this application provides a power converter, including a housing, a power device, a circuit board, a connection piece, and an inductor apparatus. The power device is installed on the circuit board, and an accommodation cavity is formed in the housing and is configured to accommodate the circuit board and the power device. A through-hole is provided on a surface that is of the housing and that faces the circuit board. The inductor apparatus is completely or partially exposed outside the housing and covers the through-hole. The connection piece extends from the circuit board in the housing to the inductor apparatus and passes through a surface of the housing, to physically connect the inductor apparatus to the housing and electrically connect the power device to the inductor apparatus at the same time.

The power converter connects the circuit board and the inductor apparatus by using the connection piece, so that the inductor apparatus can be fastened on the housing, and the inductor apparatus can also be electrically connected to the power device. After the inductor apparatus is electrically connected to the power device by using the connection piece, the connection between the inductor apparatus and the power device does not need to be implemented by using a cable to be passed through the housing for connection. It is easier to install an inductor on the power converter, and the cables in bundles do not need to be manually arranged or bundled, so that duration for a worker to assemble the inductor can be shortened, assembly efficiency can be improved, and labor costs can be reduced.

Based on the first aspect, in a possible implementation, a heat dissipation structure is further provided on an outer side of a surface of the housing, and the heat dissipation structure partially or completely surrounds the inductor apparatus, and is thermally connected to the power device, to dissipate heat for the power device.

In this possible implementation, the heat dissipation structure is thermally connected to the power device, so that heat dissipation can be performed on the power device. In addition, the heat dissipation structure partially or completely surrounds the inductor apparatus, and may also dissipate heat for the inductor apparatus.

Based on the first aspect, in a possible implementation, the inductor apparatus further includes a box body. The box body is installed on the housing and is provided with an accommodation space, and the accommodation space is capable of accommodating the inductor. The positioning piece includes a bottom plate, an installation part, a connection terminal, and a locking part. The bottom plate is disposed on the box body, and is parallel to a wall surface that is of the housing and that is provided with the through-hole. The connection terminal is disposed on the installation part, and the accommodation cavity is formed between the installation part and the connection terminal. The locking part is disposed on the connection terminal or the installation part, the locking part is located in the accommodation cavity, the installation part clamps and fastens the locking part, and the positioning piece is capable of fastening a cable by using the connection terminal.

In this possible implementation, the inductor may be fastened by disposing the inductor in the accommodation space. In addition, after the positioning piece is disposed in the inductor apparatus, an end of the cable electrically connected to the inductor can be directly connected to the connection terminal. The connection terminal is fastened to the installation part by using the locking part, so that the cable can be pre-positioned, and the cables in bundles do not need to be manually arranged or bundled.

Based on the first aspect, in a possible implementation, the connection terminal is provided with a first through-hole, and the locking part is provided on the first through-hole. The first through-hole and the locking part are in an interference fit, and the positioning piece is connected to the connection piece by using the locking part.

In this possible implementation, the locking part is disposed on the first through-hole of the connection terminal, so that the locking part and the first through-hole are in the interference fit, and the locking part and the connection terminal do not need to be fastened in another manner. In addition, the locking part is disposed on the connection terminal. When the inductor apparatus is installed, the connection terminal may be directly used, to improve assembly efficiency of the inductor apparatus.

Based on the first aspect, in a possible implementation, the connection terminal is provided with a first through-hole, the locking part is provided on a bottom wall of the installation part and corresponds to the first through-hole, and the connection piece passes through the first through-hole to connect to the locking part.

In this possible implementation, the locking part is directly disposed on the bottom wall of the installation part, so that an assembly step of the inductor apparatus is simplified, and costs can be further reduced.

Based on the first aspect, in a possible implementation, the positioning piece further includes an extension part, and the locking part has a stopping surface. The extension part is disposed on a wall surface that is of the installation part and that faces the locking part, and the extension part clamps the stopping surface of the locking part.

In this possible implementation, the extension part clamps the stopping surface, so that a stable connection can be formed between the installation part and the locking part. The connection terminal can be connected to the installation part by using the locking part, so that the installation part can position the connection terminal.

Based on the first aspect, in a possible implementation, the positioning piece further includes a stopping part, and the connection terminal is provided with a second through-hole. The stopping part is disposed in a space enclosed by the installation part, or the stopping part is disposed on a periphery of the installation part. The stopping part passes through the second through-hole, and the stopping part is capable of abutting against the connection terminal along a passing-through direction.

In this possible implementation, the stopping part is disposed, and the stopping part passes through the second through-hole, so that the stopping part is capable of abutting against the connection terminal, to correct an installation position of the connection terminal. For example, when the connection terminal is assembled with the installation part by using the locking part, the connection terminal is not placed in a correct position. After the stopping part passes through the second through-hole and abuts against the connection terminal, the placement position of the connection terminal can be corrected, so that the connection terminal is placed in a correct position, and the locking part is connected to the installation part.

Based on the first aspect, in a possible implementation, the positioning piece further includes a cable clip. The cable clip is disposed on a side that is of the connection terminal and that is away from the locking part. The cable clip is provided with an opening. The opening allows the cable to enter the cable clip, to fasten the cable.

In this possible implementation, the cable clip is disposed, and the cable clip is disposed on a side of the connection terminal. When the connection terminal is used to fasten the cable, the cable clip is capable of clamping the cable, thereby improving a case in which an end of the cable is pulled by stress and deviates from the connection terminal in a process of connecting to the connection terminal.

Based on the first aspect, in a possible implementation, the positioning piece is provided with a via hole, the accommodation space is connected to the via hole, and the via hole allows the cable to pass through.

In this possible implementation, the via hole is disposed on the positioning piece, and the cable may pass through the via hole, so that the cable is connected to the connection terminal.

Based on the first aspect, in a possible implementation, the box body is provided with a first positioning part, the positioning piece is provided with a second positioning part, and the first positioning part is connected to the second positioning part, to fasten the positioning piece on the box body.

In this possible implementation, the first positioning part and the second positioning part are connected, so that the box body may position the positioning piece, and a connection between the positioning piece and the box body is implemented, thereby improving convenience of assembling the positioning piece and the box body.

Based on the first aspect, in a possible implementation, the inductor apparatus is provided with a first fastening part, the housing is provided with a second fastening part, and the first fastening part is connected to the second fastening part, to fasten the inductor apparatus on the housing.

In this possible implementation, the first fastening part is connected to the second fastening part, so that the inductor apparatus is quickly positioned in the housing, and efficiency of assembling the housing and the inductor apparatus is improved.

Based on the first aspect, in a possible implementation, the housing is provided with two through-holes, and the power converter includes two inductor apparatuses. The two through-holes are disposed on a same wall surface of the housing, each through-hole corresponds to one inductor apparatus, and the two inductor apparatuses are disposed at an interval.

In this possible implementation, two inductor apparatuses are disposed, and different inductors may be installed to implement different functions, thereby improving applicability of the power converter.

DESCRIPTION OF REFERENCE SIGNS OF MAIN COMPONENTS

Figure 1:
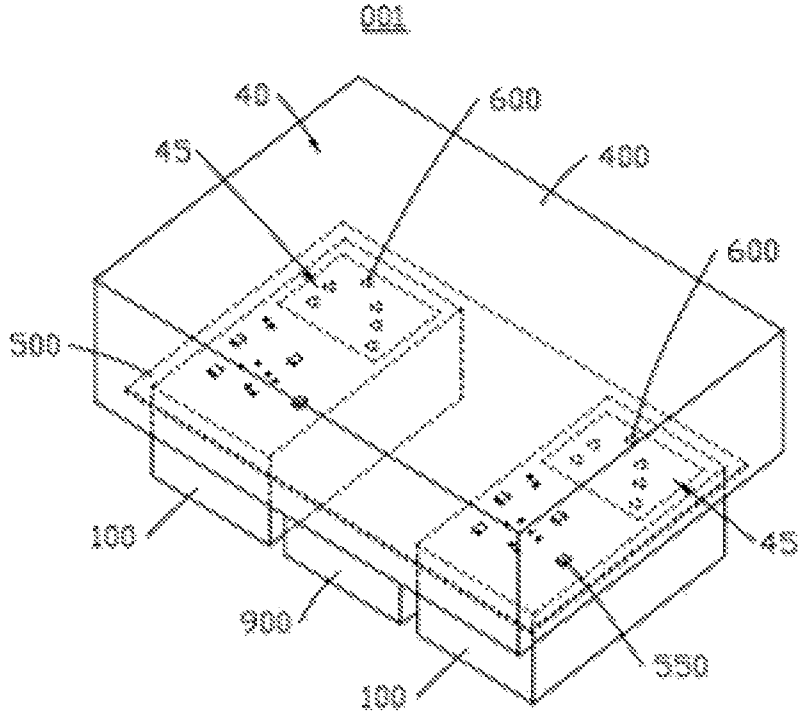
FIG. 1 is a schematic diagram of a three-dimensional structure of a power converter according to an embodiment of this application.

| | |
|---|---|
| Power converter | 001 |
| Inductor apparatus | 100 |
| Box body | 10 |
| Connection wall | 11 |
| Accommodation space | 12 |
| Partition plate | 13 |
| Clamping part | 14 |
| First positioning part | 15 |
| First fastening part | 16 |
| Positioning piece | 20 |
| Bottom plate | 21 |
| Via hole | 211 |
| Installation part | 22 |
| Connection terminal | 23 |
| First connection part | 231 |

-continued

| | |
|---|---|
| Second connection part | 232 |
| Gap | 2321 |
| First through-hole | 233 |
| Second through-hole | 234 |
| Locking part | 24 |
| Protrusion | 241 |
| Connection column | 242 |
| Stopping surface | 2421 |
| Accommodation cavity | 25 |
| Extension part | 26 |
| First region | 261 |
| Second region | 262 |
| Stopping part | 27 |
| cable clip | 28 |
| Opening | 281 |
| Second positioning part | 29 |
| Colloid | 30 |
| Housing | 400 |
| Accommodation cavity | 40 |
| Through-hole | 45, 46 |
| Circuit board | 500 |
| Power device | 550 |
| Connection piece | 600 |
| Inductor | 700 |
| Cable | 800 |
| Heat dissipation structure | 900 |

In the following implementations, this application is further described with reference to the accompanying drawings.

DESCRIPTION OF EMBODIMENTS

The following describes implementations of this application by using embodiments. A person skilled in the art may easily learn of other advantages and effects of this application based on content disclosed in this specification. Although this application is described with reference to embodiments, it does not mean that a characteristic of this application is limited only to this implementation. On the contrary, a purpose of describing this application with reference to an implementation is to cover another option or modification that may be derived based on claims of this application. To provide an in-depth understanding of this application, the following descriptions include a plurality of specific details. This application may be alternatively implemented without using these details. In addition, to avoid confusion or blurring a focus of this application, some details are omitted from the description. It should be noted that embodiments in this application and the features in embodiments may be mutually combined in the case of no conflict.

The following terms "first", "second", and the like are merely used for description, and shall not be understood as an indication or implication of relative importance or implicit indication of a quantity of indicated technical features. Therefore, a feature limited by "first", "second", or the like may explicitly or implicitly include one or more features. In description of this application, unless otherwise stated, "a plurality of" means two or more than two. Orientation terms such as "up", "down", "left", and "right" are defined relative to an orientation of schematic placement of components in the accompanying drawings. It should be understood that these directional terms are relative concepts and are used for relative description and clarification. These directional terms may vary accordingly depending on an orientation in which the components are placed in the accompanying drawings.

In this application, unless otherwise explicitly specified and limited, a term "connection" should be understood in a broad sense. For example, the "connection" may be a fastened connection, a detachable connection, or an integrated connection, and may be a direct connection or an indirect connection by using an intermediate medium. The term "and/or" used in this specification includes any and all combinations of one or more related listed items.

When the following embodiments are described in detail with reference to schematic diagrams, for ease of description, a diagram indicating a partial structure of a component is partially enlarged not based on a general scale. In addition, the schematic diagrams are merely examples, and should not limit the protection scope of this application herein.

To make the objectives, technical solutions, and advantages of this application clearer, the following further describes the implementations of this application in detail with reference to the accompanying drawings.

Figure 2:
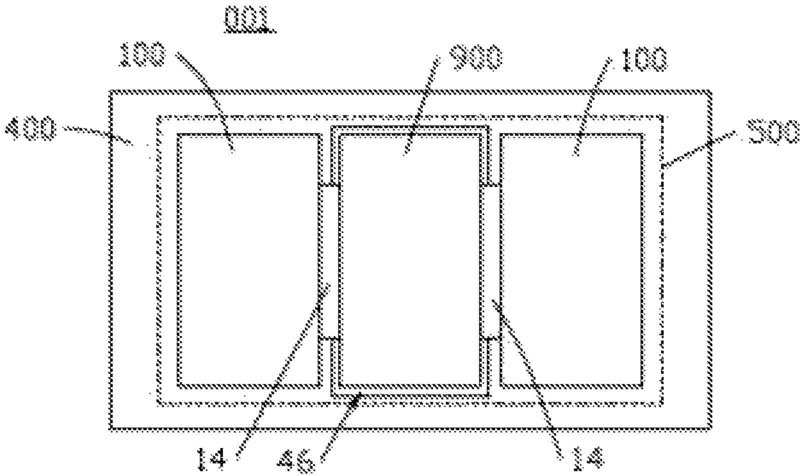
FIG. 2 is a schematic diagram of a bottom view of a structure of the power converter shown in FIG. 1.

FIG. 1 is a schematic diagram of a three-dimensional structure of a power converter 001 according to an embodiment of this application. FIG. 2 is a schematic diagram of a bottom view of a structure of the power converter 001 shown in FIG. 1.

With reference to FIG. 1 and FIG. 2, an embodiment of this application provides a power converter 001, including an inductor apparatus 100, a housing 400, a circuit board 500, a power device 550, and a connection piece 600. The power device 550 is installed on the circuit board 500, and the circuit board 500 is disposed in the housing 400. The inductor apparatus 100 is partially or completely exposed outside the housing 400. The connection piece 600 extends from the circuit board 500 in the housing 400 to the inductor apparatus 100 and passes through a surface of the housing 400, to physically connect the inductor apparatus 100 to the housing 400 and electrically connect the power device 550 to the inductor apparatus 100 at the same time. With reference to an orientation shown in FIG. 1, the inductor apparatus 100 is disposed at a lower end of the housing 400, so that when an inductor (not shown in the figure) is installed in the inductor apparatus 100, a cable may be electrically connected to the power device 550 located in the housing 400 through the inductor apparatus 100.

With reference to FIG. 1, in an embodiment, the housing 400 is rectangular, and an accommodation cavity 40 is formed in the housing 400. The accommodation cavity 40 is configured to accommodate the circuit board 500 and the power device 550. A through-hole 45 is provided on a surface that is of the housing and that faces the circuit board 500, and the accommodation cavity 40 is connected to the through-hole 45.

In an embodiment, the through-hole 45 is provided on a surface of a bottom end of the housing 400. The inductor apparatus 100 is partially or completely exposed on an outer side of the surface of the bottom end of the housing 400, and covers the through-hole 45. That is, the inductor apparatus 100 may be observed from the through-hole 45. When the circuit board 500 is disposed inside the housing 400, the circuit board 500 covers the through-hole 45, and covers the inductor apparatus 100. That the inductor apparatus 100 is partially or completely exposed outside the housing may be understood as, when the inductor apparatus 100 partially extends from the through-hole 45 to the inside of the housing 400, it may be understood that the inductor apparatus 100 is partially exposed outside the housing 400. When an overall structure of the inductor apparatus 100 does not extend to the inside of the housing 400, it may be understood that the inductor apparatus 100 is completely exposed outside the housing 400.

In an embodiment, the power converter 001 includes two inductor apparatuses 100, the housing 400 is provided with two through-holes 45, and the two through-holes 45 are disposed on a same surface of the housing 400. That is, the two through-holes 45 are disposed on the surface of the bottom end of the housing 400, and the two through-holes 45 are disposed in parallel. Each through-hole 45 corresponds to an inductor apparatus 100, and there is an interval between the two through-holes 45, so that the two inductor apparatuses 100 are disposed at an interval. Different inductors may be installed in the two inductor apparatuses 100, so that the power converter 001 may implement different functions. For example, a buck inductor may be installed in one inductor apparatus 100, and a boost inductor may be installed in the other inductor apparatus 100.

The inductor apparatus 100 is disposed on the surface of the bottom end of the housing 400, so that the inductor disposed in the inductor apparatus 100 is connected to the power device 550 disposed in the housing 400. The circuit board 500 is locked and fastened on the inductor apparatus 100 by using the connection piece 600, and the inductor may be electrically connected to the power device 550 by using the inductor apparatus 100, so that the cable does not need to extend from the inductor apparatus 100 and then pass through the housing 400 to connect to the circuit board 500. This simplifies a structure of the power converter 001 and makes assembly more convenient.

It may be understood that, in another embodiment, the inductor apparatus 100 may alternatively be disposed at another position of the housing 400. For example, when the circuit board 500 is disposed on a surface of a side wall of the housing 400, the inductor apparatus 100 may be disposed outside the side wall, so that the inductor apparatus 100 may correspond to the circuit board 500.

Figure 3:
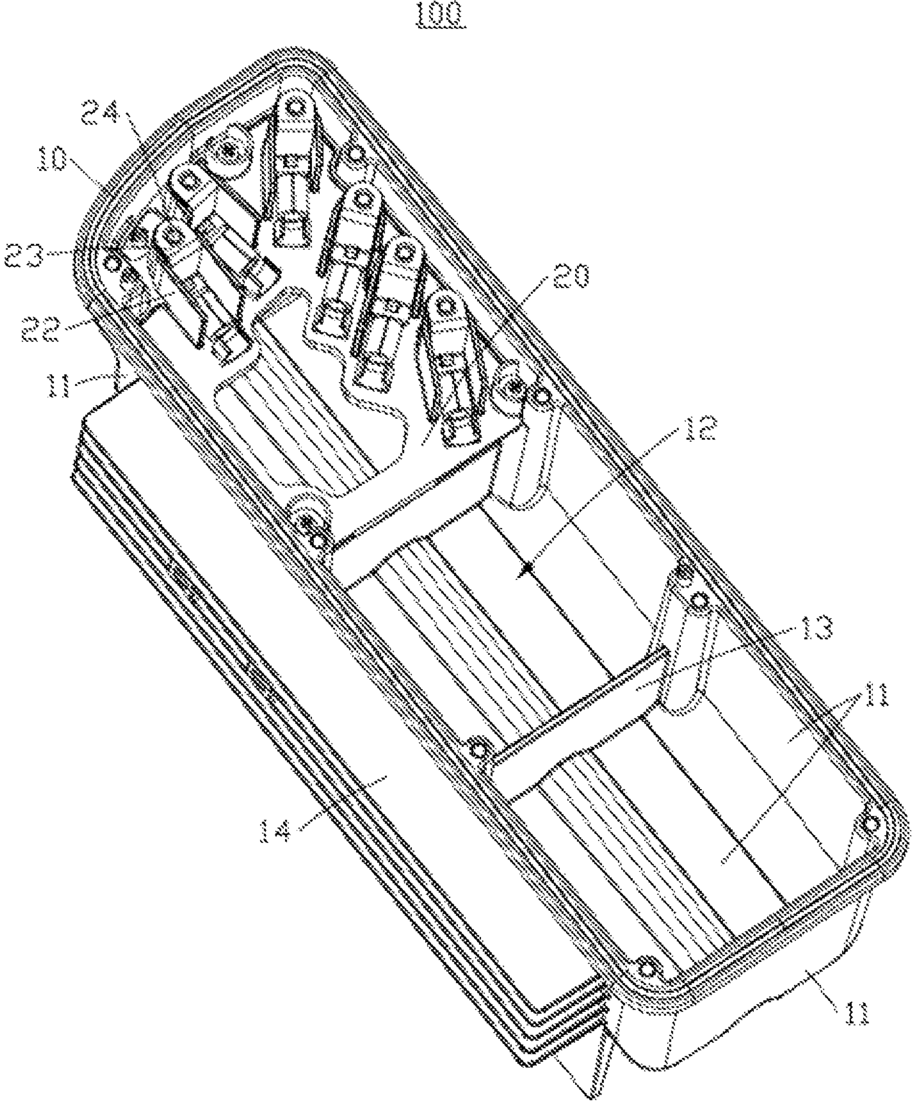
FIG. 3 is a schematic diagram of a three-dimensional structure of an inductor apparatus in the power converter shown in FIG. 1.
Figure 4:
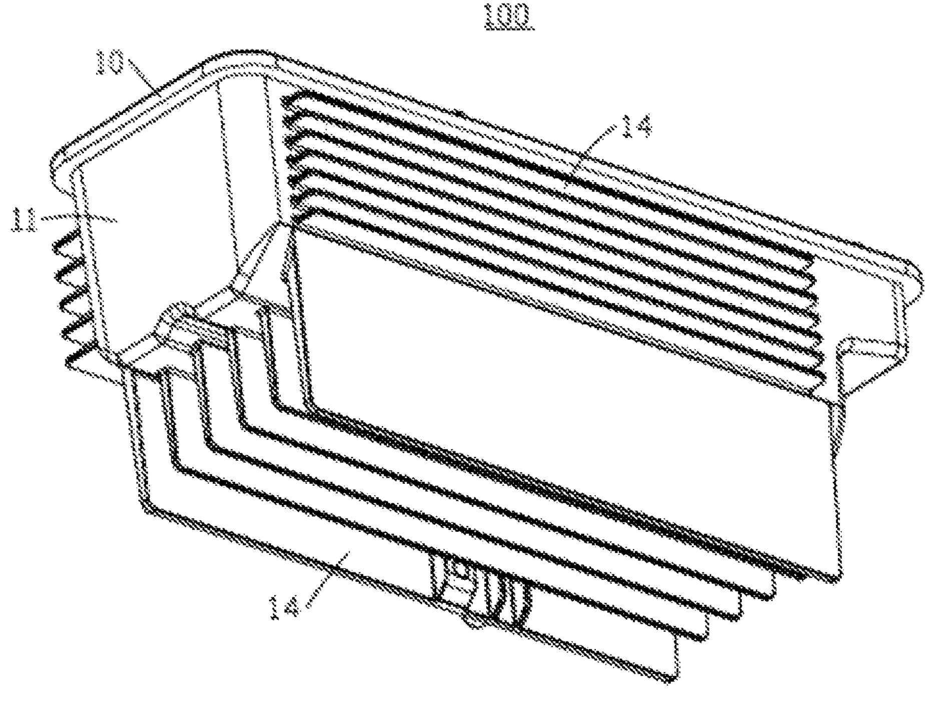
FIG. 4 is a schematic diagram of a three-dimensional structure of the inductor apparatus shown in FIG. 3 from another perspective.

FIG. 3 is a schematic diagram of a three-dimensional structure of an inductor apparatus 100 in the power converter 001 shown in FIG. 1. FIG. 4 is a schematic diagram of a three-dimensional structure of the inductor apparatus 100 shown in FIG. 3 from another perspective.

With reference to FIG. 3 and FIG. 4, the inductor apparatus 100 is configured to fasten an inductor (not shown in the figure) and a cable (not shown in the figure) electrically connected to the inductor. The inductor apparatus 100 includes a box body 10 and a positioning piece 20 disposed in the box body 10. The box body 10 is configured to accommodate the inductor, and the positioning piece 20 may electrically connect an end that is of the cable and that is not connected to the inductor. When the inductor is disposed in the inductor apparatus 100, cables in bundles do not need to be bundled and arranged, and the positioning piece 20 may pre-position the cables. The pre-positioning may be understood as that, when the inductor apparatus 100 is disposed on the housing 400 of the power converter 001, the inductor is to be connected to another component disposed on the circuit board 500 through a cable. To facilitate connection between the cable and the circuit board 500, the cable is to be positioned, to improve a case in which deviation occurs during connection of the cable. After the cable is positioned by using the positioning piece 20, when the inductor apparatus 100 is disposed on the housing 400, the cable that has been pre-positioned does not need to be positioned.

Figure 5:
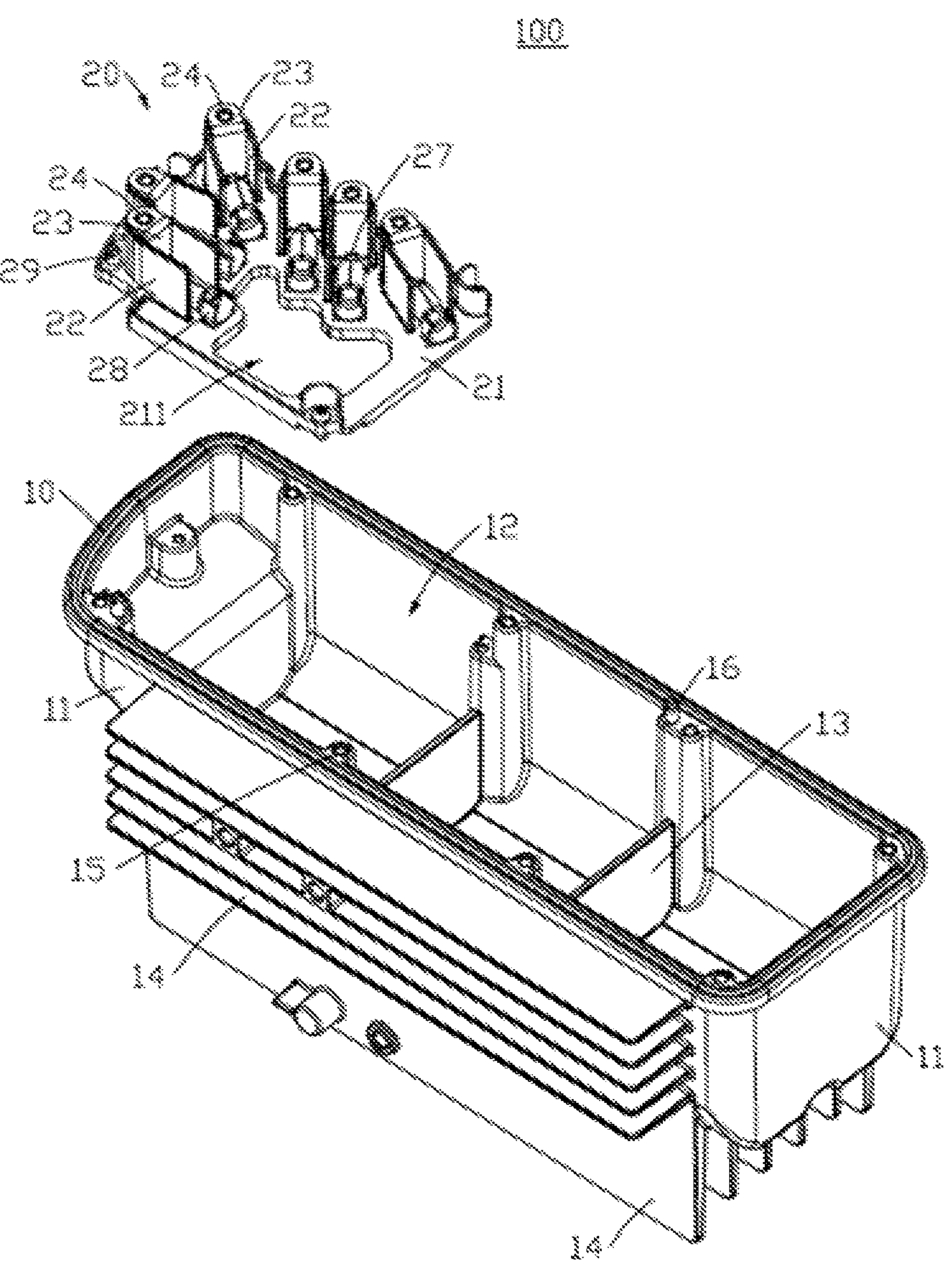
FIG. 5 is a schematic diagram of an exploded structure of the inductor apparatus shown in FIG. 3.
Figure 6:
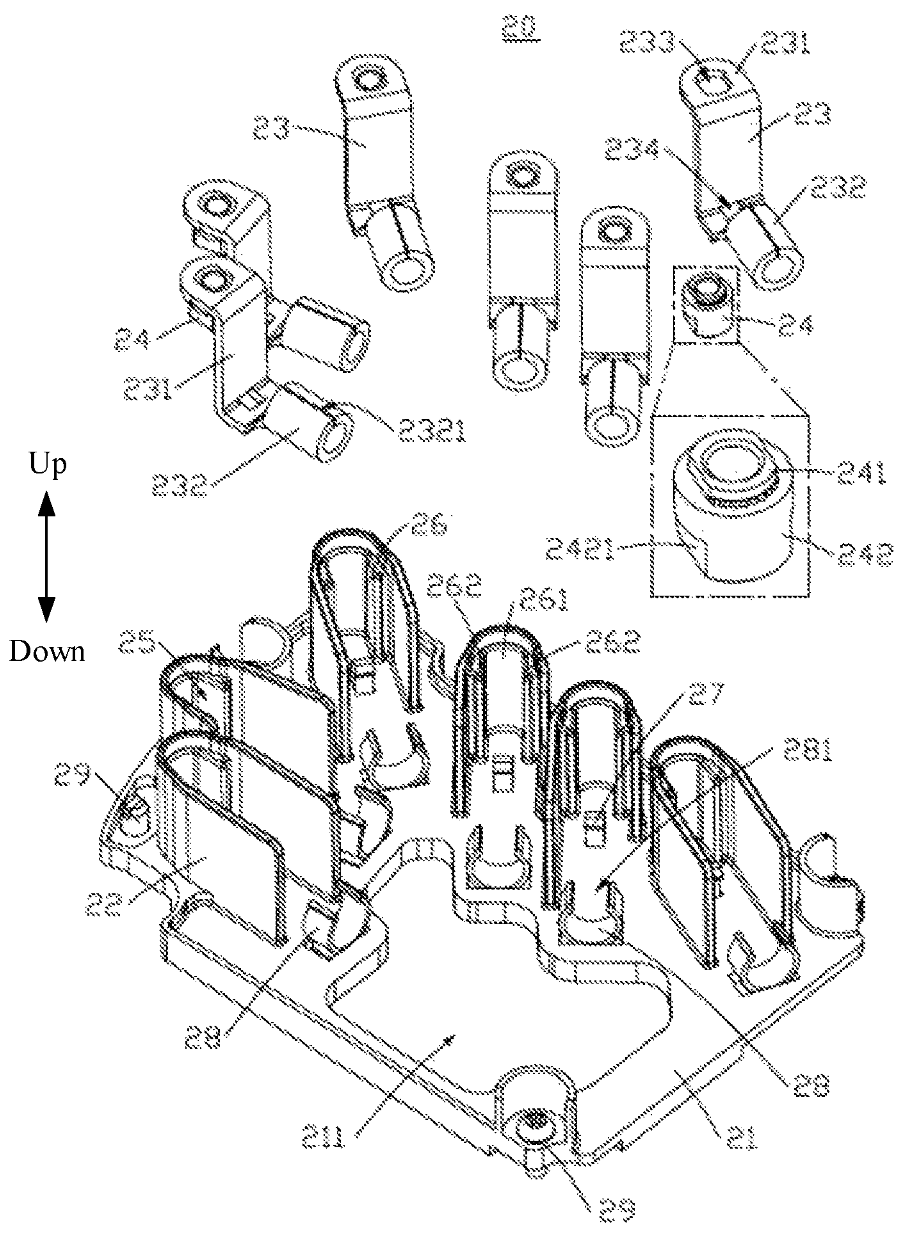
FIG. 6 is a schematic diagram of an exploded structure of a positioning piece in the inductor apparatus shown in FIG. 5.

FIG. 5 is a schematic diagram of an exploded structure of the inductor apparatus 100 shown in FIG. 3. FIG. 6 is a schematic diagram of an exploded structure of a positioning piece 20 in the inductor apparatus 100 shown in FIG. 5.

With reference to FIG. 5 and FIG. 6, the box body 10 is installed on the housing 400. The box body 10 includes a plurality of connection walls 11, and the plurality of connection walls 11 are sequentially connected. The box body 10 is provided with an accommodation space 12, the plurality of connection walls 11 are enclosed to form the accommodation space 12, and the accommodation space 12 is capable of accommodating the inductor. In an embodiment, the box body 10 has an opening, and the inductor may be placed in the accommodation space 12 from the opening.

In an embodiment, a plurality of partition plates 13 are disposed in the box body 10, the plurality of partition plates 13 are disposed in the box body 10 at intervals, and each partition plate 13 is fastened to the connection wall 11. The plurality of partition plates 13 space the accommodation space 12 into a plurality of accommodation cavities. One inductor may be disposed in each accommodation cavity, and the partition plate 13 may contact an end part of the inductor, so that the partition plate 13 may receive heat generated by the inductor, dissipate the heat, and dissipate heat for the inductor, thereby improving use duration of the inductor.

In an embodiment, an outer surface of the box body 10 is further provided with a clamping part 14. The clamping part 14 extends from an outer surface of the connection wall 11 in a direction away from the connection wall 11, and the outer surface of the connection wall 11 is provided with a plurality of clamping parts 14. The box body 10 may be connected to another structure by using the clamping part 14. For example, when the power converter 001 is disposed on another device, the clamping part 14 may be connected to a structure on the another device, for example, connected in a clamping manner, so that the box body 10 may be fastened to the another device.

In an embodiment, the clamping part 14 may further dissipate heat. For example, the clamping part 14 is made of a thermally conductive material. When the inductor apparatus 100 is installed, the clamping part 14 may be clamped on a heat dissipation structure (not shown in the figure). When the inductor generates heat, the heat may be transferred to the box body 10, and then the box body 10 transfers the heat to the clamping part 14. The heat dissipation structure may dissipate the heat for the clamping part 14, thereby reducing a temperature of the inductor apparatus 100.

With reference to FIG. 5 and FIG. 6, the positioning piece 20 is disposed on the box body 10, and the positioning piece 20 is located at a position that is in the accommodation space 12 and that is near the opening of the box body 10. That is, the positioning piece 20 is close to the bottom end of the housing 400. In an embodiment, the positioning piece 20 includes a bottom plate 21, the positioning piece 20 is installed on the box body 10 by using the bottom plate 21, and the bottom plate 21 is parallel to a surface that is of the housing 400 and that is provided with the through-hole 45. With reference to an orientation shown in FIG. 5, that is, the bottom plate 21 is parallel to the bottom end of the housing 400.

In an embodiment, the positioning piece 20 is provided with a via hole 211, the accommodation space 12 is connected to the via hole 211, and the via hole 211 allows the cable (not shown in the figure) to pass through. The via hole 211 is disposed on the bottom plate 21. When an inductor is disposed in the box body 10, the inductor may be exposed from the via hole 211. The via hole 211 is disposed on the bottom plate 21, so that the cable electrically connected to the inductor may pass through the via hole 211, and then connect to another structure on the positioning piece 20, without a need for the cable to bypass the bottom plate 21.

The positioning piece 20 further includes an installation part 22, a connection terminal 23, and a locking part 24. The connection terminal 23 is disposed on the installation part 22, and an accommodation cavity 25 is formed between the installation part 22 and the connection terminal 23. The locking part 24 is disposed on the connection terminal 23 or the installation part 22, and the locking part 24 is located in the accommodation cavity 25. The installation part 22 clamps and fastens the locking part 24, and the positioning piece 20 fastens the cable by using the connection terminal 23. The installation part 22, a connection terminal 23, and the locking part 24 are all located on a side that is of the bottom plate 21 and that is away from a bottom wall of the box body 10, so that the connection terminal 23 that is electrically connected to the cable may be connected to the circuit board 500 in the power converter 001.

In an embodiment, the positioning piece 20 includes a plurality of installation parts 22, a plurality of connection terminals 23, and a plurality of locking parts 24. The plurality of installation parts 22, the plurality of connection terminals 23, and the plurality of locking parts 24 are in a one-to-one correspondence. That is, one installation part 22, one connection terminal 23, and one locking part 24 are connected. The plurality of installation parts 22 may be arranged on the bottom plate 21 based on a specific situation. The plurality of connection terminals 23 are disposed, so that the positioning piece 20 may pre-position a plurality of cables. The area of the through-hole 45 provided on the housing 400 may adapt to a size of the bottom plate 21, so that the installation part 22, the connection terminal 23, and the locking part 24 are exposed in the through-hole 45, to improve a situation that when a cable exists in the box body 10, the through-hole 45 of the housing 400 is too large, and the cable may extend into the housing 400 through the through-hole 45 to contact the circuit board 500.

Generally, the inductor apparatus is disposed outside the power converter, and the cables led out from the inductor apparatus need to pass through a box of the power converter and enter the box. The cables led out from the inductor apparatus are led out in bundles. In other words, a plurality of cables are led out at the same time. However, when the cables in bundles are led out from the inductor apparatus and then are inserted into the box of the power converter, to prevent the cables from occupying much space, the cables in bundles need to be manually arranged, which requires long working duration and high labor costs. In addition, the cables in bundles also need to be bundled, and costs of a bundling material need to be invested. In addition, after the cables are inserted into the box of the power converter, to facilitate connection between the cable and an internal component of the power converter, the cable is to be positioned.

Based on this case, in the inductor apparatus 100 provided in this embodiment of this application, after the inductor is disposed in the box body 10, the positioning piece 20 is disposed in the box body 10, the positioning piece 20 may be electrically connected to the cable by using the connection terminal 23, and the connection terminal 23 is fastened to the installation part 22 by using the locking part 24, so that the cable may be pre-positioned. After the plurality of connection terminals 23 are disposed, each connection terminal 23 may be electrically connected to one cable, and each cable is directly connected to the connection terminal 23 without manually arranging and bundling the cables in bundles. The inductor apparatus 100 may shorten working duration of a worker, improve assembly efficiency, and reduce labor costs. In addition, the inductor apparatus 100 provided in this embodiment of this application is used, and the cables do not need to be bundled, so that costs of the bundling material are reduced.

With reference to FIG. 6, the installation part 22 extends a preset distance from the bottom plate 21 in a direction away from the bottom plate 21. The installation part 22 adopts a profiling design. That is, the installation part 22 is disposed with reference to an outer contour of the locking part 24, so that the installation part 22 may clamp and fasten the locking part 24. In an embodiment, a part that is of the installation part 22 and that extends out of the bottom plate 21 is approximately half an elliptical arc-shaped structure, so that the installation part 22 and the connection terminal 23 may be enclosed to form the accommodation cavity 25, to implement connection between the installation part 22, the connection terminal 23, and the locking part 24, and facilitate cable positioning. In addition, the bottom plate 21 is disposed in parallel to the bottom end of the housing 400, and the installation part 22 may extend in a direction perpendicular to the bottom plate 21, to facilitate installation of the connection piece 600.

It may be understood that, in another embodiment, a shape of the part that is of the installation part 22 and that extends out of the bottom plate 21 may be replaced with another shape. For example, the shape of the installation part 22 may be replaced with a semi-circular shape or the like.

With reference to FIG. 6, to better describe the structure of the positioning piece 20, the positioning piece 20 is described with reference to an up-down direction. The connection terminal 23 includes a first connection part 231 and a second connection part 232 connected to the first connection part 231. The first connection part 231 is configured to connect to the locking part 24, and the second connection part 232 is configured to connect to a cable.

In an embodiment, the first connection part 231 is approximately Z-shaped. An upper end of the first connection part 231 is configured to connect the locking part 24, a lower end of the first connection part 231 is connected to the second connection part 232. A length of the first connection part 231 along an up-down direction is approximately the same as an extension length of the installation part 22, so that the accommodation cavity 25 may be formed between the installation part 22 and the first connection part 231.

In an embodiment, a contour of the second connection part 232 is approximately the same as a contour of the cable, so that the second connection part 232 may fasten the cable. The second connection part 232 is provided with a gap 2321, so that when the cable is inserted into the second connection part 232, the second connection part 232 is driven by the cable to deform to clamp and fasten the cable. The second connection part 232 is fastened to the cable through welding.

It may be understood that, in another embodiment, a shape of the first connection part 231 is not limited thereto. For example, the first connection part 231 may be replaced with a T shape. For ease of inserting the cable, the second connection part 232 may also be disposed in a square structure or the like, so that the cable may extend into the second connection part 232 more conveniently.

With reference to FIG. 6, in an embodiment, the locking part 24 is disposed on the connection terminal 23. The connection terminal 23 is provided with a first through-hole 233, the locking part 24 is provided on the first through-hole 233, and the first through-hole 233 and the locking part 24 are in an interference fit. The locking part 24 and the first through-hole 233 are in the interference fit, and the locking part 24 and the connection terminal 23 do not need to be fastened in another manner. In addition, the locking part 24 is disposed on the connection terminal 23, and when the inductor apparatus 100 is assembled, the connection terminal 23 may be directly used, to improve assembly efficiency of the inductor apparatus 100.

In an embodiment, the locking part 24 includes a protrusion 241. The protrusion 241 is disposed on the first through-hole 233, and the first through-hole 233 and the protrusion 241 are in the interference fit. The upper end of the first connection part 231 of the connection terminal 23 is provided with the first through-hole 233, and the protrusion 241 is provided with saw-teeth. When the protrusion 241 is inserted into the first through-hole 233, an inner wall of the first through-hole 233 is squeezed by the protrusion 241 to deform, thereby generating locking effect, and implementing fastening between the connection terminal 23 and the locking part 24. The protrusion 241 and the first through-hole 233 are in the interference fit, and the locking part 24 does not need to be fastened to the connection terminal 23 in another manner, so that installation between the locking part 24 and the connection terminal 23 is simpler.

In an embodiment, the locking part 24 further includes a connection column 242, and the protrusion 241 is disposed on the connection column 242. After the locking part 24 is connected to the connection terminal 23 by using the protrusion 241, the connection terminal 23 provided with the locking part 24 is assembled with the installation part 22. In this case, the installation part 22 and the connection terminal 23 form the accommodation cavity 25, and the connection column 242 of the locking part 24 is located in the accommodation cavity 25. A shape of the installation part 22 is approximately the same as an outer contour of the connection column 242, so that the installation part 22 may clamp and fasten the connection column 242, to implement connection between the installation part 22 and the locking part 24. In this way, the connection terminal 23 is fastened to the installation part 22.

In an embodiment, the positioning piece 20 further includes an extension part 26, and the locking part 24 has a stopping surface 2421. The extension part 26 is disposed on a wall surface that is of the installation part 22 and that faces the locking part 24, and the extension part 26 clamps the stopping surface 2421 of the locking part 24. The extension part 26 is provided on an inner wall surface of the installation part 22 on which the accommodation cavity 25 is formed. The extension part 26 has a first region 261 and a second region 262 connected to the first region 261, and a thickness of the second region 262 is greater than a thickness of the first region 261. The extension part 26 may improve stability of installation between the installation part 22 and the locking part 24. A stopping surface 2421 is provided at a position corresponding to the second region 262 on the connection column 242, and the stopping surface 2421 is a plane. Surfaces of the connection column 242 at other positions are arc surfaces other than the stopping surface 2421. When the locking part 24 is connected to the installation part 22, the second region 262 of the extension part 26 clamps the stopping surface 2421 of the connection column 242, so that a fixed connection between the installation part 22 and the locking part 24 can be implemented. In addition, a case in which the locking part 24 rotates relative to the installation part 22 can also be avoided.

It may be understood that the installation part 22 and the extension part 26 may be an integrated structure.

Figure 7:
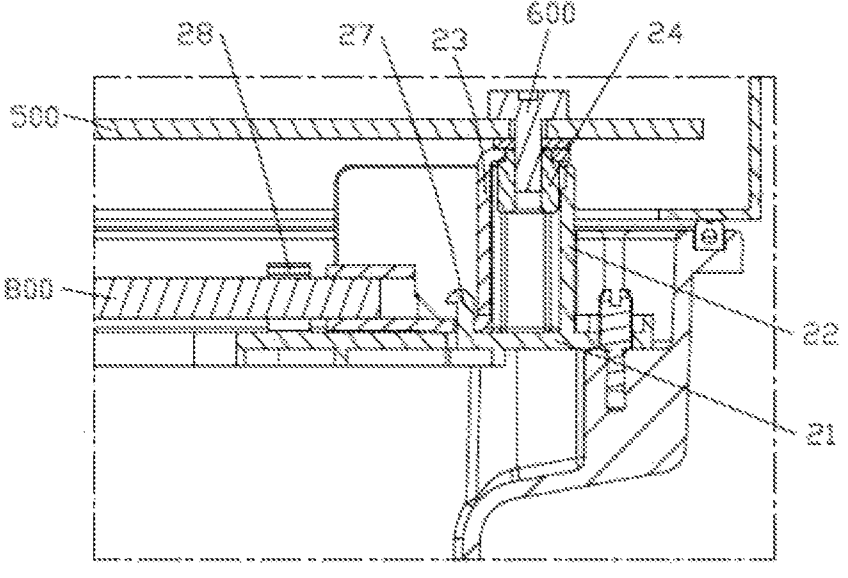
FIG. 7 is a partial schematic sectional view in which a connection piece passes through a circuit board and is connected to a positioning piece in the power converter shown in FIG. 1.

FIG. 7 is a partial schematic sectional view in which a connection piece 600 passes through a circuit board 500 and is connected to a positioning piece 20 in the power converter 001 shown in FIG. 1.

With reference to FIG. 7, when the connection terminal 23 and the installation part 22 form the accommodation cavity 25, the upper end of the first connection part 231 of the connection terminal 23 abuts against an upper surface of the installation part 22, and the installation part 22 may support the connection terminal 23. In an embodiment, the distance that the installation part 22 extends away from the bottom plate 21 may be set based on the connection piece 600 that is matched with the locking part 24. For example, when the connection terminal 23 is to be connected to the circuit board 500, the connection piece 600 may be used to fasten the connection terminal 23 to the circuit board 500. After passing through the circuit board 500 and a surface of the housing 400, the connection piece 600 continues to extend to the connection terminal 23 and the locking part 24. After the locking part 24 is locked with the connection piece 600, the circuit board 500 is connected to the inductor apparatus 100, to implement physical fastening of the inductor apparatus 100 to the housing 400.

In an embodiment, the distance extended by the installation part 22 is greater than the distance extended by the connection piece 600 into the locking part 24, so that the accommodation cavity 25 may accommodate the connection piece 600. In this way, interference between the connection piece 600 and the bottom plate 21 caused by an excessively short extension distance of the installation part 22 can be avoided, thereby preventing the locking part 24 from being unable to be locked with the connection piece 600.

In an embodiment, the locking part 24 may be a self-clinching nut, and the self-clinching nut may be directly installed on the connection terminal 23, and may be directly used after being installed. The installation is simple and operation is convenient. It may be understood that, in another embodiment, the locking part 24 may be replaced with another structure having an equivalent effect or function.

With reference to FIG. 5 and FIG. 6, in an embodiment, the positioning piece 20 further includes a stopping part 27, and the connection terminal 23 is further provided with a second through-hole 234. The stopping part 27 is disposed in a space enclosed by the installation part 22, or the stopping part 27 is disposed on a periphery of the installation part 22. The stopping part 27 passes through the second through-hole 234, and the stopping part 27 is capable of abutting against the connection terminal 23 along a passing-through direction. The stopping part 27 is disposed on the bottom plate 21, the second through-hole 234 is disposed at the lower end of the first connection part 231 of the connection terminal 23. The stopping part 27 passes through the second through-hole 234 and is capable of abutting against the first connection part 231. The stopping part 27 is disposed, and the stopping part 27 passes through the first connection part 231 and abuts against the first connection part 231, to correct an installation position of the connection terminal 23.

For example, when the connection terminal 23 is to be installed with the installation part 22 by using the locking part 24, the connection terminal 23 may not be aligned in the up-down direction but may be tilted. In this case, the stopping part 27 passes through the second through-hole 234 and abuts against the connection terminal 23, so that a placement position of the connection terminal 23 may be corrected, and the position of the connection terminal 23 may be aligned. Alternatively, when the positioning piece 20 is manufactured, a tolerance in dimensions may exist between the connection terminal 23 and the installation part 22, and the position of the connection terminal 23 may also be corrected by using the stopping part 27. The stopping part 27 is disposed, and the position of the connection terminal 23 may be corrected. In addition, after the connection terminal 23 is placed, installation between the installation part 22 and the locking part 24 is more convenient.

It may be understood that, in another embodiment, when the connection terminal 23 and the installation part 22 are assembled, and may correspond to an assembly position, the stopping part 27 and the second through-hole 234 that adapts to the stopping part 27 may also be canceled.

With reference to FIG. 5 and FIG. 6, in an embodiment, the positioning piece 20 further includes a cable clip 28. The cable clip 28 is disposed on a side that is of the connection terminal 23 and that is away from the locking part 24, and the cable clip 28 is provided with an opening 281. The opening 281 allows the cable to enter the cable clip 28 to fasten the cable. The cable clip 28 is disposed on the bottom plate 21, and is located on a side of the second connection part 232 of the connection terminal 23. The cable clip 28 is provided with an opening 281. When the cable is to be fastened, the cable may be installed in the cable clip 28 from a position of the opening 281, and the cable clip 28 clamps the cable. In addition, a contour of the cable clip 28 is the same as a contour of the cable, so that the cable is better fastened, and the cable does not shake in the cable clip 28.

The cable clip 28 is disposed, and the cable clip 28 is disposed on a side of the connection terminal 23. When the connection terminal 23 is used to fasten the cable, the cable clip 28 is capable of clamping the cable, thereby improving a case in which an end of the cable is pulled by stress and deviates from the connection terminal 23 in a process of connecting to the connection terminal 23.

It may be understood that, the positioning piece 20 is provided with a plurality of stopping parts 27 and a plurality of cable clips 28, and each stopping part 27 and each cable clip 28 cooperate with a connection terminal 23.

With reference to FIG. 5, in an embodiment, the box body 10 is provided with a first positioning part 15, and the positioning piece 20 is provided with a second positioning part 29. The first positioning part 15 is connected to the second positioning part 29, to fasten the positioning piece 20 to the box body 10. The first positioning part 15 is disposed on an inner wall surface of the connection wall 11, and the second positioning part 29 is disposed at an edge position of the bottom plate 21. The first positioning part 15 may be a positioning column, and the second positioning part 29 may be a positioning hole. The positioning column passes through the positioning hole, so that the housing may limit the positioning piece 20. In order to make connection between the box body 10 and the positioning piece 20 more stable, the positioning column and the positioning hole are in an interference fit.

It may be understood that, in another embodiment, the first positioning part 15 and the second positioning part 29 may alternatively be fastened in another manner. For example, the first positioning part 15 may be a positioning hole, and the second positioning part 29 may be a positioning column. It may be further understood that both the first positioning part 15 and the second positioning part 29 may be positioning holes, and the first positioning part 15 and the second positioning part 29 are locked by using a fastening structure, for example, a screw. Alternatively, the first positioning part 15 may be a buckle, and the second positioning part 29 may be a buckle. Through cooperation between the buckle and a clamping hole, the box body 10 may be fastened to the positioning piece 20.

With reference to FIG. 5, in an embodiment, the inductor apparatus 100 is provided with a first fastening part 16, and the housing 400 is provided with a second fastening part (not shown in the figure). The first fastening part 16 is connected to the second fastening part, to fasten the inductor apparatus 100 to the housing 400. The first fastening part 16 is disposed on the box body 10, and the first fastening part 16 is disposed on the inner wall surface of the connection wall 11. The second fastening part is disposed on the inner wall surface of the housing 400, and corresponds to a position of the first fastening part 16.

In an embodiment, the first fastening part 16 may be a fastening column, and the second fastening part may be a fastening hole. The fastening column passes through the fastening hole, so that the box body 10 may be installed in the housing 400. In order to make the connection between the box body 10 and the housing 400 more stable, the clamping part 14 on the box body 10 may be clamped on a structure inside the housing 400. It may be understood that, when the fastening column is matched with the fastening hole, the interference fitting may be used, so that the box body 10 may be directly connected to the housing 400 by using the fastening column and the fastening hole.

It may be understood that, in another embodiment, the first fastening part 16 may alternatively be fastened to the second fastening part in another manner. For example, a structure between the first fastening part 16 and the second fastening part may be replaced, where the first fastening part 16 is a fastening hole, and the second fastening part is a fastening column. It may be further understood that both the first fastening part 16 and the second fastening part may be positioning holes, and the first fastening part 16 and the second fastening part are locked by using a fastening structure, for example, a screw. Alternatively, the first fastening part 16 may be a buckle, and the second fastening part may be a buckle. Through cooperation between the buckle and the clamping hole, the box body 10 may be fastened to the housing 400.

Figure 8:
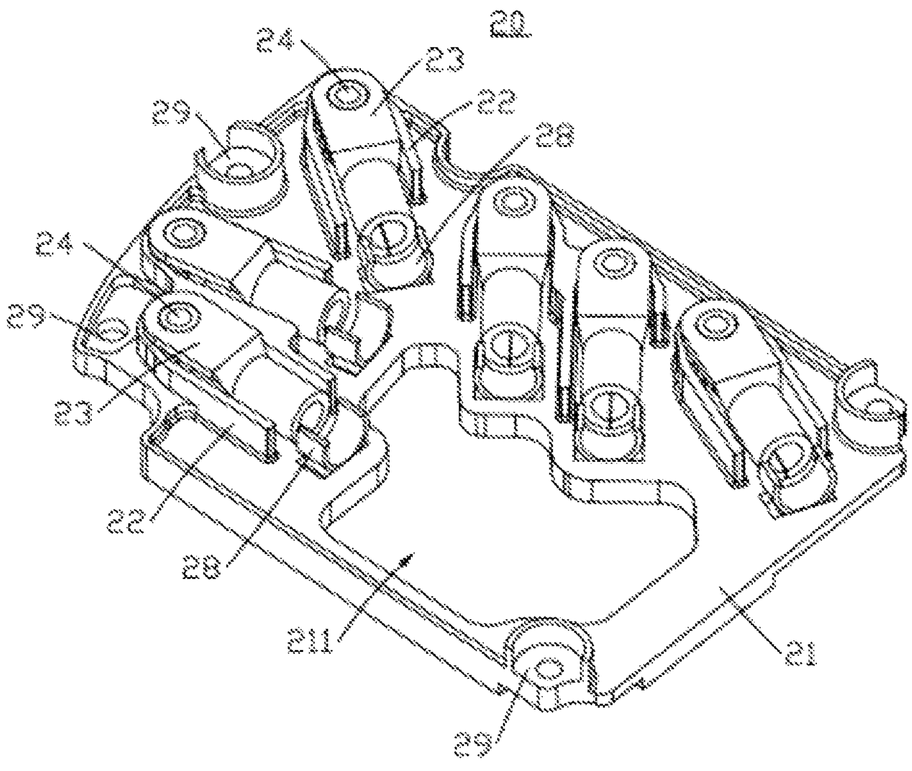
FIG. 8 is a schematic diagram of a three-dimensional structure of a positioning piece in an inductor apparatus according to another embodiment of this application.

FIG. 8 is a schematic diagram of a three-dimensional structure of a positioning piece 20 in an inductor apparatus 100 according to another embodiment of this application.

With reference to FIG. 8, a structure of the positioning piece 20 in the inductor apparatus 100 according to another embodiment of this application is approximately the same as that of the positioning piece 20 shown in FIG. 5. A difference lies in that the first through-hole 233 is provided on the connection terminal 23, and the locking part 24 is disposed on a bottom wall of the installation part 22 and corresponds to the first through-hole 233, so that the locking part 24 may be connected to the connection piece 600 that runs through the first through-hole 233. The bottom plate 21 may be the bottom wall of the installation part 22, or the bottom wall of the installation part 22 and the bottom plate 21 may be an integrated structure. In this embodiment, a distance extended by the installation part 22 towards a side that is away from the bottom plate 21 may be the same as the height of the locking part 24, so that the locking part 24 is fastened, and the locking part 24 is disposed more reliably. Then, the first through-hole 233 provided on the connection terminal 23 corresponds to the locking part 24. When the connection piece 600 is connected to the locking part 24 through the connection terminal 23, a connection between the connection terminal 23 and the locking part 24 is implemented, and the cable may also be pre-fastened.

After the distance extended by the installation part 22 to adapt to the locking part 24 is reduced, a distance extended by the connection terminal 23 along the up-down direction is also reduced accordingly to adapt to the installation part 22 to form the accommodation cavity 25. In an embodiment, the connection terminal 23 may be an optical terminal such as an OT terminal, and the locking part 24 may be a nut. When the inductor apparatus 100 is assembled, the locking part 24 may be directly disposed on the installation part 22, and may be fastened by using the installation part 22. Compared with the assembling step in which the locking part 24 is disposed on the connection terminal 23 and then connected to the installation part 22, the assembling step is simpler. In an assembly process, a worker may directly dispose the locking part 24 on the installation part 22, thereby improving an assembly speed and reducing labor costs.

Because the distance extended by the connection terminal 23 along the direction away from the bottom plate 21 is reduced, the probability that the connection terminal 23 is not placed upright is reduced in the process of installing the connection terminal 23 and the installation part 22. Therefore, in this embodiment, the stopping part 27 shown in FIG. 5 may be canceled.

The OT terminal is used as the connection terminal 23, and the nut is disposed on the bottom wall of the installation part 22. The two structures are cheap, so that costs required for manufacturing the inductor apparatus 100 are reduced. It may be understood that, in another embodiment, the connection terminal 23 and the locking part 24 may be alternatively replaced with other structures having equivalent effects or functions.

The connection terminal 23 in the foregoing embodiment may work with the connection piece 600 to fasten the circuit board 500 to the inductor apparatus 100, so that physical fastening between the housing 400 and the inductor apparatus 100 is implemented. In addition, to implement electrical connection to the cable, the connection terminal 23 is made of an electrically conductive material, to implement electrical connection between the inductor apparatus 100 and the power device 550. The connection terminal 23 may be made of a metal material, for example, copper, aluminum, or iron. Alternatively, the connection terminal 23 may be made of an alloy material, for example, an alloy of nickel and copper.

The inductor apparatus 100 in the foregoing embodiment is used to fasten the inductor and the cable. The inductor is fastened in the box body 10, one end of the cable is electrically connected to the inductor, and the other end of the cable may be electrically connected to the connection terminal 23 through the via hole 211 of the positioning piece 20. The positioning piece 20 may pre-fasten the cables, and each cable may be electrically connected to the connection terminal 23, and the cables may be directly connected to the connection terminal 23 without taking more time to arrange the cables in bundles.

The positioning piece 20 may be of an integrated structure. The positioning piece 20 may be manufactured in an injection molding manner.

Figure 9:
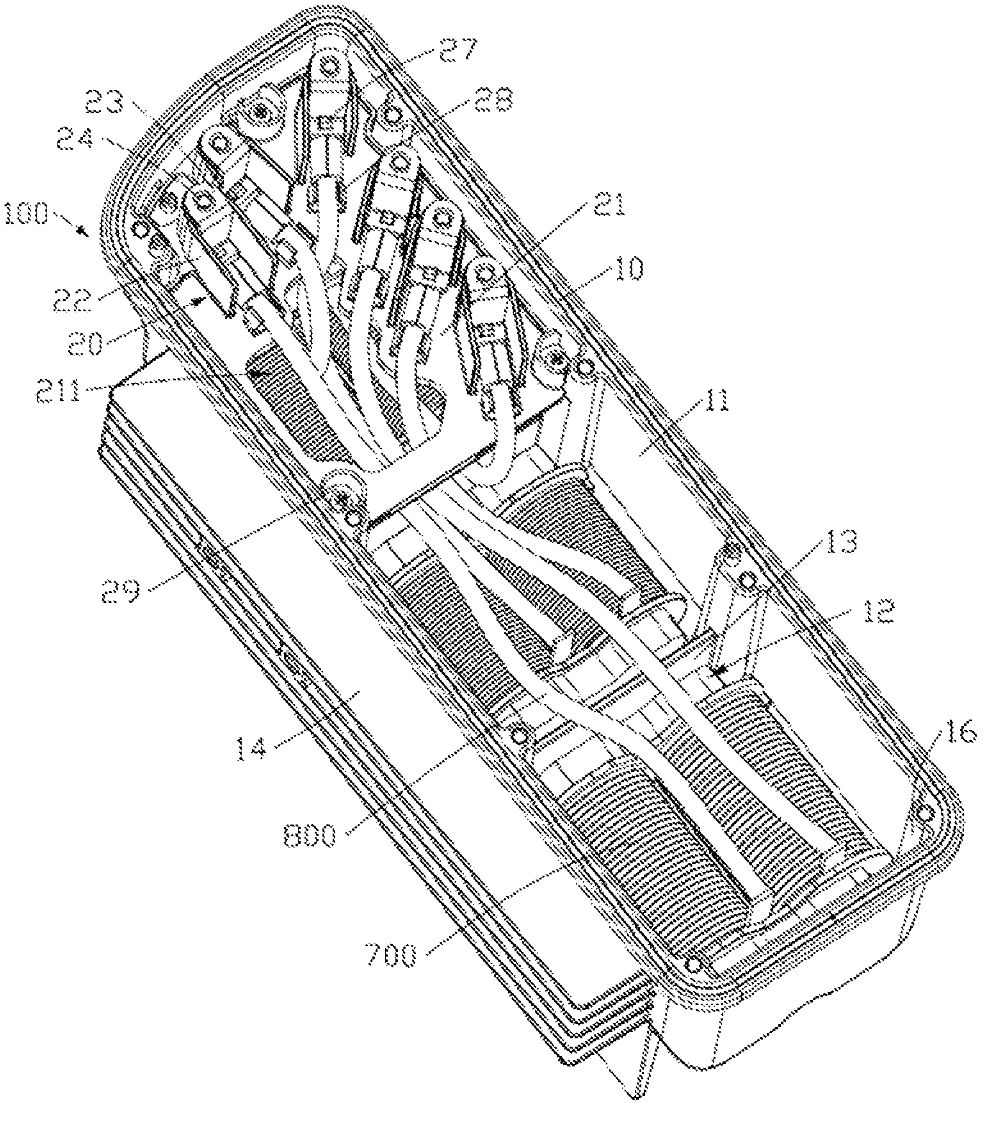
FIG. 9 is a schematic diagram of a three-dimensional structure of the inductor apparatus shown in FIG. 3 provided with an inductor.

FIG. 9 is a schematic diagram of a three-dimensional structure of the inductor apparatus 100 shown in FIG. 3 provided with an inductor 700.

With reference to FIG. 9, the inductor 700 is disposed in the accommodation space 12 of the box body 10, and the other end of the cable 800 is electrically connected to the connection terminal 23. The inductor 700 is disposed in the box body 10, and is limited by the connection wall 11, to improve a situation in which the inductor 700 shakes. One end of the cable 800 is electrically connected to the inductor 700, and the other end is electrically connected to the connection terminal 23 after passing through the via hole 211 provided by the positioning piece 20.

In an embodiment, the accommodation space 12 of the box body 10 is spaced by the partition plate 13 to provide three accommodation cavities, and one inductor 700 is provided in each accommodation cavity. When the cable 800 is connected to the connection terminal 23, whether the cable 800 is to pass through the via hole 211 may be specifically set. For example, when the farthest connection terminal 23 of the inductor apparatus 100 needs to be electrically conductive, after being connected to the inductor 700, the cable 800 may pass through the via hole 211 to connect to the connection terminal 23. In this case, passing through the via hole 211 may improve a situation in which the cable 800 is to be wound, and passing through the via hole 211 may also play a role of arranging, thereby improving a situation in which wiring of the cable 800 is disordered. For another example, when electrical conduction is to be implemented between the closer inductor 700 and the connection terminal 23, after being connected to the inductor 700, the cable 800 may be directly connected to the connection terminal 23 without passing through the via hole 211.

It may be understood that, in another embodiment, a quantity of accommodation cavities that are spaced from the accommodation space 12 is not limited thereto, and may be set based on a specific requirement. For example, the accommodation space 12 may be spaced into four or five accommodation cavities.

Figure 10:
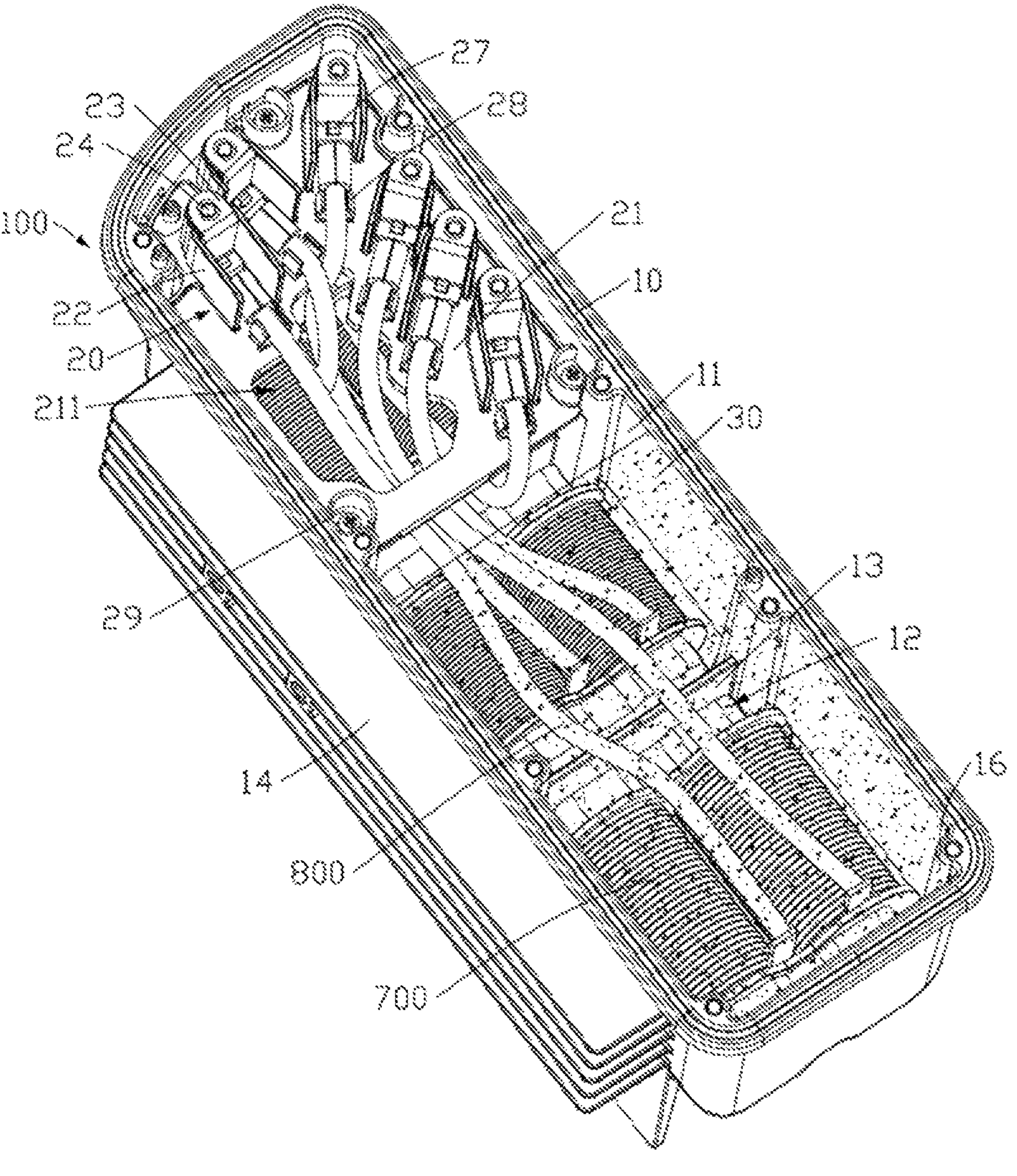
FIG. 10 is a schematic diagram of a three-dimensional structure of the inductor apparatus shown in FIG. 9 provided with a colloid.

FIG. 10 is a schematic diagram of a three-dimensional structure of the inductor apparatus 100 shown in FIG. 9 provided with a colloid 30.

With reference to FIG. 10, in an embodiment, the inductor apparatus 100 further includes a colloid 30. The colloid 30 is disposed in the accommodation space 12, and the colloid 30 covers a part of the inductor 700 and is in contact with the inductor 700. After the inductor 700 and the cable 800 are disposed, the box body 10 is filled with a melted colloid 30, and after the colloid 30 is solidified, heat dissipation may be performed on the inductor 700.

After the inductor 700 and the cable 800 are separately placed and connected, the box body 10 may be filled with the colloid 30. Alternatively, after the inductor 700 is disposed, the end part of the cable 800 that is to be connected to the connection terminal 23 is led out from the accommodation space 12 or the via hole 211. After the box body 10 is filled with the colloid 30, the cable 800 is connected to the connection terminal 23. In an embodiment, the colloid 30 is a thermally conductive adhesive. The thermally conductive adhesive is disposed on the surface of the inductor 700. After the thermally conductive adhesive solidifies, installation stability of the inductor 700 can be improved. In addition, heat generated by the inductor 700 can be dissipated.

In an embodiment, a position filled by the colloid 30 does not exceed an end of the positioning piece 20. That is, along a length direction of the box body 10, the colloid 30 is disposed not to exceed an edge of the positioning piece 20, to solve a problem that interference is caused to disassembly of the positioning piece 20 after the colloid 30 is solidified.

With reference to FIG. 7, the circuit board 500 covers the through-hole 45, and covers the positioning piece 20 exposed on the through-hole 45. The connection piece 600 passes through the circuit board 500 and is connected to the locking part 24. The circuit board 500 and the box body 10 are located on two opposite sides of the bottom end of the housing 400. The circuit board 500 is provided with a connection hole (not shown in the figure), the connection hole corresponds to the first through-hole 233 of the connection terminal 23. The connection piece 600 may pass through the connection hole and the first through-hole 233 to connect to the locking part 24, and one end of a conductive line on the circuit board 500 is led to the connection hole. The power device 550 on the circuit board 500 may be disposed on the circuit board 500 in a welding manner, and the other end of the conductive line on the circuit board 500 may be electrically connected to the power device 550. The power device 550 may include but is not limited to a resistor, a capacitor, a transformer, a diode, and the like.

In an embodiment, the connection piece 600 is a fastening screw, and the connection piece 600 is connected to the locking part 24 in a threaded manner, and the connection piece 600 is also a conductive piece, so that the inductor apparatus 100 and the circuit board 500 are fastened by using a physical connection between the connection piece 600 and the locking part 24. The connection piece 600 and the locking part 24 may be electrically connected, so that the power device 550 disposed on the circuit board 500 may be electrically connected to the inductor in the inductor apparatus 100. It may be understood that, in another embodiment, the connection piece 600 may be alternatively replaced with another structure having equivalent effect or function.

When the cable 800 in the inductor apparatus 100 is connected to the circuit board 500, the cable 800 does not need to be led out from the box body 10 of the inductor apparatus 100 and then led into the housing 400 of the power converter 001 to connect to the circuit board 500. The inductor apparatus 100 is provided with the inductor 700 and the cable 800 may be directly installed on the housing 400 of the power converter 001. The circuit board 500 is fastened by using the connection terminal 23 and the connection piece 600, and then the connection terminal 23 is connected to the cable 800, so that the inductor 700 may be electrically connected to a component on the circuit board 500 by using the cable 800. The power converter 001 has a simple structure, and is convenient for installation. The installation does not need to a long time, thereby improving installation efficiency. For example, the inductor apparatus 100 is disposed at a lower end of the housing 400. When it is necessary to connect the circuit board 500 disposed in the housing 400 to the inductor 700 in the inductor apparatus 100, the circuit board 500 is locked on one side of the inductor apparatus 100 by using the connection piece 600 and the locking part 24, so that the component on the circuit board 500 may be electrically connected to the inductor 700.

In an embodiment, the inductor apparatus may also be directly assembled in an automatic manner, and the inductor apparatus 100 assembled with the inductor 700 may be directly installed on an outer side of the housing 400 of the power converter 001 to connect to the circuit board 500.

With reference to FIG. 1 and FIG. 2, in an embodiment, the power converter 001 further includes a heat dissipation structure 900. The heat dissipation structure 900 is disposed on an outer side of a surface of the housing 400, and partially or completely surrounds the inductor apparatus 100. The heat dissipation structure 900 is thermally connected to the power device 550, to dissipate heat for the power device 550.

In an embodiment, the power converter 001 includes two inductor apparatuses 100, and the heat dissipation structure 900 is located between the two inductor apparatuses 100. The heat dissipation structure 900 includes a heat sink and a fan, and is configured to dissipate heat for the power device 550 in the power converter 001. A manner in which the heat dissipation structure 900 is thermally connected to the power device 550 may be as follows. Another through-hole 46 may be disposed on one surface of the housing 400, so that the heat sink in the heat dissipation structure 900 may extend to the housing 400, and may be attached to one side of the circuit board 500 and combined with a heat dissipation fan, to dissipate heat for the power device 550 disposed on the circuit board 500. Alternatively, the heat dissipation structure 900 may further include thermally conductive silicone, so that the thermally conductive silicone may be connected to the power device 550 to dissipate heat for the power device 550.

It may be understood that a manner of thermal connection between the heat dissipation structure 900 and the power device 550 is not limited thereto, and may be replaced with another manner having equivalent effect or function. For example, the heat dissipation structure 900 may further include a thermal pad, and the thermal pad is connected to the power device 550 to dissipate heat for the power device 550.

In addition, the heat dissipation structure 900 may also dissipate heat for the inductor apparatus 100. The heat dissipation structure 900 and the inductor apparatus 100 are located on a same side of the housing 400. Air flow generated by the fan in the heat dissipation structure 900 may flow to positions of the inductor apparatuses 100 on both sides, so that heat generated by the inductors in the inductor apparatus 100 may be dissipated.

In an embodiment, a part of the heat dissipation structure 900 may be disposed around the inductor apparatus 100. It may be understood that the power converter 001 may also include a plurality of heat dissipation structures 900, and the plurality of heat dissipation structures 900 are all disposed around the inductor apparatus 100.

In the power converter 001 in this embodiment, the inductor apparatus 100 is disposed on the housing 400, so that the length of the cable 800 required to be set is shortened, and the connection between the inductor 700 and the circuit board 500 in the power converter 001 is implemented. In addition, the production efficiency of the power converter 001 can be improved by using the assembled inductor apparatus.

The foregoing descriptions are implementations of this application, and are not intended to limit the protection scope of this application. Any variation or replacement within the technical scope disclosed in this application shall fall within the disclosed scope of this application.

The invention claimed is:

1. A power converter, comprising:
- a circuit board;
- a power device coupled to the circuit board;
- a housing comprising:
  - a first surface;
  - an accommodation cavity configured to accommodate the circuit board; and
  - a first through-hole on the first surface, wherein the first through-hole faces the circuit board;
- a first inductor apparatus that is completely exposed outside the housing or partially exposed outside the housing, wherein the first inductor apparatus covers the first through-hole, and wherein the first inductor apparatus comprises a positioning piece comprising:
  - an installation part;
  - a connection terminal disposed on the installation part; and a locking part disposed on the connection terminal, wherein the installation part clamps and fastens the locking part, and wherein the positioning piece is configured to fasten a cable using the connection terminal; and a connection piece that extends from the circuit board in the housing to the first inductor apparatus and passes through the first surface to physically connect the first inductor apparatus to the housing and electrically connect the power device to the first inductor apparatus, wherein the connection piece is configured to fasten the connection terminal to the circuit board.

2. The power converter of claim 1, wherein the first surface comprises an outer side, wherein the power converter further comprises a heat dissipation structure on the outer side, wherein the heat dissipation structure partially surrounds the first inductor apparatus or completely surrounds the first inductor apparatus, and wherein the heat dissipation structure is thermally connected to the power device and is configured to dissipate heat of the power device.

3. The power converter of claim 1, wherein the housing comprises a second surface comprising the first through-hole, wherein the first inductor apparatus further comprises a box body comprising a second accommodation cavity that is configured to accommodate an inductor, wherein the box body is coupled to the housing, wherein the positioning piece further comprises a bottom plate disposed on the box body, wherein the bottom plate is parallel to the second surface, wherein the accommodation cavity is formed between the installation part and the connection terminal, and wherein the locking part is located in the accommodation cavity.

4. The power converter of claim 3, wherein the connection terminal is provided with a second through-hole, wherein the locking part is disposed on the second through-hole, wherein the locking part is in an interference fit with the second through-hole, and wherein the locking part is configured to connect the positioning piece to the connection piece.

5. The power converter of claim 3, wherein the installation part comprises a bottom wall, wherein the connection terminal comprises a second through-hole, wherein the locking part is disposed on the bottom wall and corresponds to the second through-hole, and wherein the connection piece is configured to pass through the second through-hole and connect to the locking part.

6. The power converter of claim 3, wherein the installation part comprises a third surface that faces the locking part, wherein the positioning piece further comprises an extension part, wherein the locking part has a stopping surface, wherein the extension part is disposed on the third surface, and wherein the extension part clamps the stopping surface.

7. The power converter of claim 3, wherein the installation part encloses a space, wherein the positioning piece further comprises a stopping part, wherein the connection terminal comprises a third through-hole, wherein the stopping part is disposed in the space or on a periphery of the installation part wherein the stopping part passes through the third through-hole, and wherein the stopping part is configured to abut against the connection terminal along a passing-through direction.

8. The power converter of claim 3, wherein the connection terminal comprises a first side, wherein the positioning piece further comprises a cable clip that is disposed on the first side and that is away from the locking part, and wherein the cable clip is provided with an opening that is configured to permit the cable to enter the cable clip for fastening the cable.

9. The power converter of claim 3, wherein the positioning piece comprises a via hole, wherein the accommodation cavity is connected to the via hole, and wherein the via hole is configured to permit the cable to pass through.

10. The power converter of claim 3, wherein the box body comprises a first positioning part, wherein the positioning piece comprises a second positioning part, and wherein the first positioning part is configured to connect to the second positioning part to fasten the positioning piece to the box body.

11. The power converter of claim 1, wherein the first inductor apparatus comprises a first fastening part, wherein the housing comprises a second fastening part, and wherein the first fastening part is configured to connect to the second fastening part to fasten the first inductor apparatus to the housing.

12. The power converter of claim 3, wherein the installation part comprises a wall surface, wherein the positioning piece further comprises an extension part, wherein the locking part has a stopping surface, wherein the extension part is disposed on the wall surface and faces the locking part, and wherein the extension part clamps the stopping surface of the locking part.

13. A power converter, comprising:

a circuit board;

a power device installed on the circuit board;

a housing comprising:

a first surface further comprising:

an outer side;

an accommodation cavity configured to accommodate the circuit board; and a first through-hole on the first surface, wherein the first through-hole faces the circuit board;

a heat dissipation structure disposed on the outer side, wherein the heat dissipation structure is thermally connected to the power device and is configured to dissipate heat of the power device;

a first inductor apparatus that is completely or partially exposed outside the housing, wherein the first inductor apparatus covers the first through-hole, wherein the heat dissipation structure partially surrounds the first inductor apparatus or completely surrounds the first inductor apparatus, and wherein the first inductor apparatus comprises a positioning piece comprising:

an installation part;

a connection terminal disposed on the installation part; and a locking part disposed on the connection terminal, wherein the installation part clamps and fastens the locking part, and wherein the positioning piece is configured to fasten a cable using the connection terminal; and a connection piece that extends from the circuit board in the housing to the first inductor apparatus, and passes through the first surface to physically connect the first inductor apparatus to the housing and electrically connect the power device to the first inductor apparatus, wherein the connection piece is configured to fasten the connection terminal to the circuit board.

14. The power converter of claim 13, wherein the housing comprises a second surface comprising the first through-hole, wherein the first inductor apparatus comprises: further comprises a box body comprising a second accommodation cavity that is configured to accommodate an inductor, wherein the box body is coupled to the housing, wherein the positioning piece further comprises a bottom plate disposed on the box body, wherein the bottom plate is parallel to the second surface, wherein the accommodation cavity is formed between the installation part and the connection terminal, and wherein the locking part is located in the accommodation cavity.

15. The power converter of claim 14, wherein the connection terminal is provided with a second through-hole, wherein the locking part is disposed on the second through-hole, wherein the locking part is in an interference fit with the second through-hole, and wherein the locking part is configured to connect the positioning piece to the connection piece.

16. The power converter of claim 14, wherein the installation part comprises a bottom wall, wherein the connection terminal comprises a second through-hole, wherein the locking part is disposed on the bottom wall and corresponds to the second through-hole, and wherein the connection piece is configured to pass through the second through-hole and connect to the locking part.

17. The power converter of claim 14, wherein the installation part comprises a third surface that faces the locking part, wherein the positioning piece further comprises an extension part, wherein the locking part has a stopping surface; and wherein the extension part is disposed on the third surface, and wherein the extension part clamps the stopping surface.

18. The power converter of claim 14, wherein the installation part encloses a space, wherein the positioning piece further comprises a stopping part, wherein the connection terminal comprises a third through-hole, wherein the stopping part is disposed in the space or on a periphery of the installation part, wherein the stopping part passes through the third through-hole, and wherein the stopping part is configured to abut against the connection terminal along a passing-through direction.

19. The power converter of claim 14, wherein the connection terminal comprises a first side, wherein the positioning piece further comprises a cable clip that is disposed on the first side and that is away from the locking part, and wherein the cable clip is provided with an opening that is configured to permit the cable to enter the cable clip for fastening the cable.

20. A power converter, comprising:

a circuit board;

a power device coupled to the circuit board;

a housing comprising:

a first surface;

an accommodation cavity configured to accommodate the circuit board; and a first through-hole on the first surface, wherein the first through-hole faces the circuit board;

a first inductor apparatus that is completely exposed outside the housing or partially exposed outside the housing, wherein the first inductor apparatus covers the first through-hole; and a connection piece that extends from the circuit board in the housing to the first inductor apparatus and passes through the first surface to physically connect the first inductor apparatus to the housing and electrically connect the power device to the first inductor apparatus, wherein the housing further comprises a second through-hole, wherein the power converter further comprises a second inductor apparatus, wherein the first through-hole and the second through-hole are disposed on a same surface of the housing, wherein the first through-hole and the second through-hole respectively correspond to the first inductor apparatus and the second inductor apparatus, and wherein the first inductor apparatus and the second inductor apparatus are disposed at an interval.

* * * * *